United States Patent [19]

Aiton et al.

[11] Patent Number: 5,049,925

[45] Date of Patent: Sep. 17, 1991

[54] METHOD AND APPARATUS FOR FOCUSING A WAFER STEPPER

[75] Inventors: John Aiton, Boise; Patrick W. Vaughn, Caldwell; Eugene DeLarosa, Boise, all of Id.

[73] Assignee: Micron Technology, Inc., Boise, Id.

[21] Appl. No.: 511,272

[22] Filed: Apr. 20, 1990

[51] Int. Cl.$^5$ .............................................. G03B 27/42
[52] U.S. Cl. ......................................... 355/53; 355/77
[58] Field of Search ................... 355/53, 54, 86, 77; 356/124, 124.5, 125, 123

[56] References Cited

U.S. PATENT DOCUMENTS

| | | |
|---|---|---|
| 4,203,031 | 5/1980 | Kamachi et al. . |
| 4,320,496 | 3/1982 | Aoki et al. . |
| 4,510,384 | 4/1985 | Grimbleby et al. . |
| 4,582,427 | 4/1986 | Hutchin .............................. 356/124.5 |
| 4,614,865 | 7/1986 | Hayashi . |
| 4,672,188 | 6/1987 | Cohen . |
| 4,698,492 | 10/1987 | Ohtaka et al. . |
| 4,740,678 | 4/1988 | Horikawa . |
| 4,759,626 | 7/1988 | Kroko .............................. 356/124 |
| 4,963,924 | 10/1990 | Gill et al. .............................. 355/77 |

*Primary Examiner*—Brian W. Brown
*Assistant Examiner*—Khanh Dang
*Attorney, Agent, or Firm*—Marger, Johnson, McCollom & Stolowitz

[57] ABSTRACT

A reticle for use in a wafer stepper of the type in which a lens projects the image of a mask to create a lithographically-defined pattern on a wafer. The reticle includes a plurality of parallel, opaque rectangles formed therein. The rectangles are uniform in size with the width of each rectangle bearing a ratio to the distance between adjacent rectangles of approximately 4:1.

13 Claims, 5 Drawing Sheets

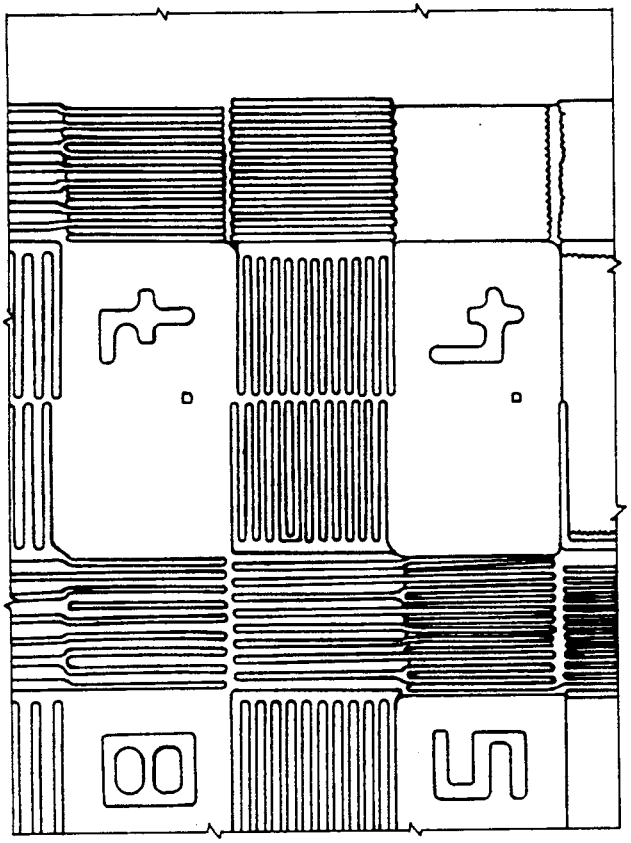
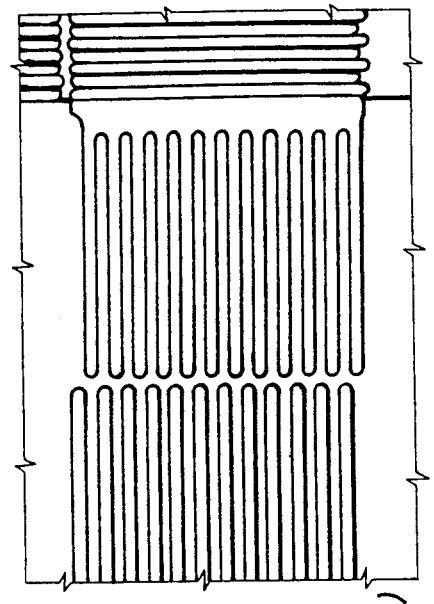
Fig. 11
(PRIOR ART)
Fig. 12
(PRIOR ART)
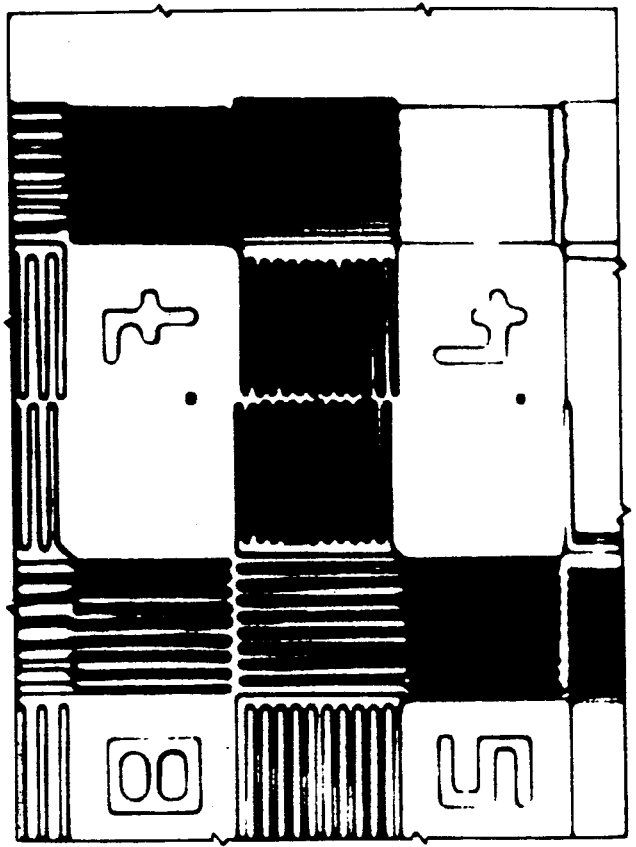
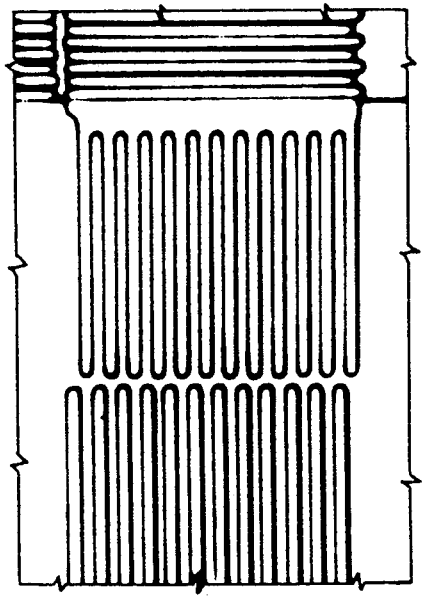
Fig. 9
(PRIOR ART)
Fig. 10
(PRIOR ART)

METHOD AND APPARATUS FOR FOCUSING A WAFER STEPPER

BACKGROUND OF THE INVENTION

1. Field of the Invention

The present invention relates to methods and apparatus for focusing a wafer stepper and more particularly to such methods and apparatus in which a focusing reticle is used to project an image of alternating bands of light onto the surface of a wafer.

2. Description of the Related Art

In the fabrication of integrated circuits, a plurality of such circuits are typically formed on a single wafer. When wafer fabrication is complete, the wafer is cut so that each circuit is contained on a single piece of wafer which is known as a die.

The integrated circuits are formed on the wafer using a lithographic process in which the wafer is coated with a layer of photoresist. A machine known as a wafer stepper is used to project the image of a mask onto the photoresist. The mask image defines a pattern which makes up one of the layers in the integrated circuit. Since a plurality of such circuits are formed on a single wafer, the wafer stepper moves the wafer in a predetermined pattern to permit the mask image to be projected onto each area of the wafer upon which an integrated circuit is formed. After the image is projected onto each such area, the wafer is developed and additional processing is performed. The wafer is again coated with photoresist and the wafer stepper is used to project the image of a different mask onto each circuit in the wafer thereby forming the next layer in the integrated circuit.

The wafer stepper includes a light source, a mask holder, a focusing lens and a wafer table for supporting a wafer thereon. In operation, light from a lamp passes through the mask and then through the lens which projects an image of the mask onto the surface of the wafer. The lens and wafer table are arranged so that the focal plane of the lens and the surface of the wafer supported on the table are substantially parallel. The wafer table is moveable in increments as small as 0.2 micron so as to move the table toward and away from the lens focal plane while maintaining the focal plane parallel to the table. This facilitates precision focusing of the lens. Such focusing is necessary to produce lines in the lithographically-created image on the wafer which can be smaller than one micron in width.

One prior art method and apparatus for focusing the lens of such a wafer stepper on a wafer projects the image of a reticle onto the surface of the wafer. The reticle includes alternating opaque and transparent bands which are each of the same with. The image projected thus comprises alternating bands of light and darkness which are substantially equal to one another in width. The reticle includes a series of different sized bands having widths ranging from about 0.4 to about 2.0 microns. Each set, regardless of its band width, includes alternating transparent and opaque bands having equal widths.

When using such a reticle to focus a wafer stepper, the stepper is first placed in nominal focus. A wafer supported on the wafer table includes a layer of photoresist thereon. The reticle image is sequentially exposed on a number of different locations on the wafer with the wafer table being vertically moved a preselected distance, e.g., 0.3 micron, between each exposure. Thereafter the wafer is developed and examined through a microscope. Images which are out of focus include bridging or smudging between adjacent lines formed in the photoresist. The image which has the best focus is selected and the wafer table is set to the same position at which the in-focus reticle image was obtained.

Gage repeatability is the variation in measurements obtained when one operator uses the same gage for measuring the same characteristic of the same part. Empirical testing of the prior art reticle described above found poor repeatability for determining which reticle image is best focused. The average range of the wafer table position was 0.4 microns. In other words, the same operator using the same exposed wafer to focus the wafer stepper could set the table anywhere over a 0.4 micron range each time the stepper is focused.

It would be desirable to more accurately focus the wafer stepper.

SUMMARY OF THE INVENTION

Method and apparatus for focusing a lens system of the type in which a lens projects the image of a mask to create a lithographically-defined pattern on a wafer. The lens has a focal plane which is substantially parallel to the surface of a wafer received in the system. Means are provided for adjusting the relative positions of the lens focal plane and the surface of the wafer. A reticle includes a plurality of parallel, opaque rectangles formed therein. A plurality of elongate transparent segments are disposed between the rectangles. The segments have elongate edges which define the edges of adjacent rectangles. The width of the rectangles has a ratio to the width of the segments of in excess 2:1.

It is a general object of the present invention to provide a method and apparatus for focusing a wafer stepper which overcomes the disadvantages associated with prior art methods and apparatus.

It is a more specific object of the present invention to provide such a method and apparatus which more accurately focuses the wafer stepper.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 9 is an enlarged view of an unfocused prior art reticle image on a wafer.

FIG. 10 is an enlarged view of FIG. 9.

FIG. 11 is an enlarged view of a relatively focused prior art reticle image on a wafer.

FIG. 12 is an enlarged view of FIG. 11.

DETAILED DESCRIPTION OF THE PREFERRED EMBODIMENT

Figure 1:
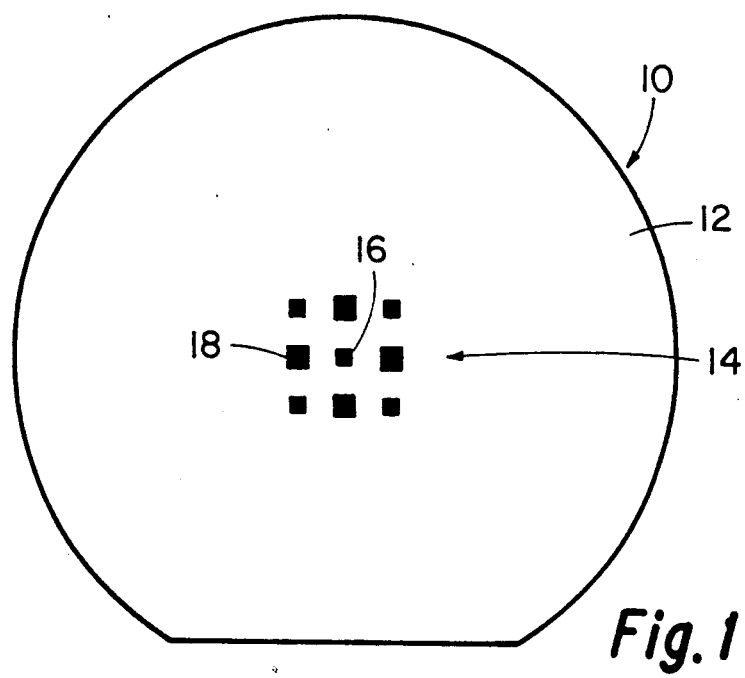
FIG. 1 is a top plan view of a wafer having a layer of photoresist thereon which is exposed and developed.

Turning now to FIG. 1, a wafer 10 is fabricated from silicon in a known manner for the purpose of forming a plurality of integrated circuits thereon. The top surface of wafer 10 is coated with a layer of photoresist 12, a portion of which has been exposed and developed using a conventional developing process. Indicated generally at 14 is a matrix field which comprises a lithographically-defined pattern created by the exposure and development of photoresist 12. The procedure for creating matrix field 14 will be described in more detail hereinafter.

The matrix field includes 9 substantially identical matrices, two of which are matrices 16, 18. In the present implementation of the invention, the center of matrix 16 is separated from the center of matrix 18 by 34.625 millimeters. Similarly, the center of each matrix in field 14 is 34.625 millimeters from the center of each matrix which is horizontally of vertically adjacent thereto.

Figure 2:
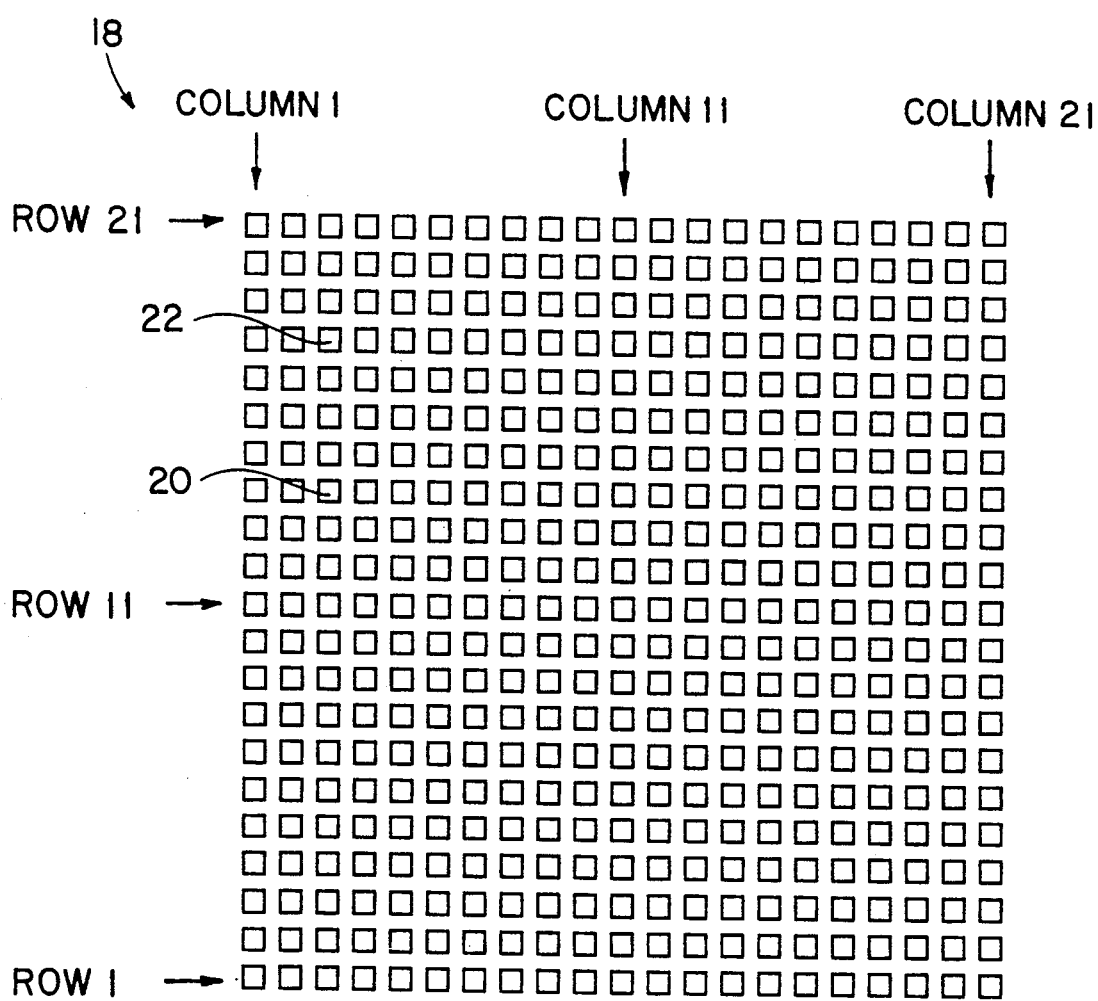
FIG. 2 is an enlarged view of a portion of the developed photoresist on the wafer in FIG. 1.

Turning now to FIG. 2, matrix 18 includes a plurality of reticle images, like images 20, 22, defined in photoresist 12. The reticle images are arranged in a rectangular pattern in rows and columns of 21 images each. Each of the other matrixes in field 14 include the same 21×21 matrix of reticle images as matrix 18.

Figure 3:
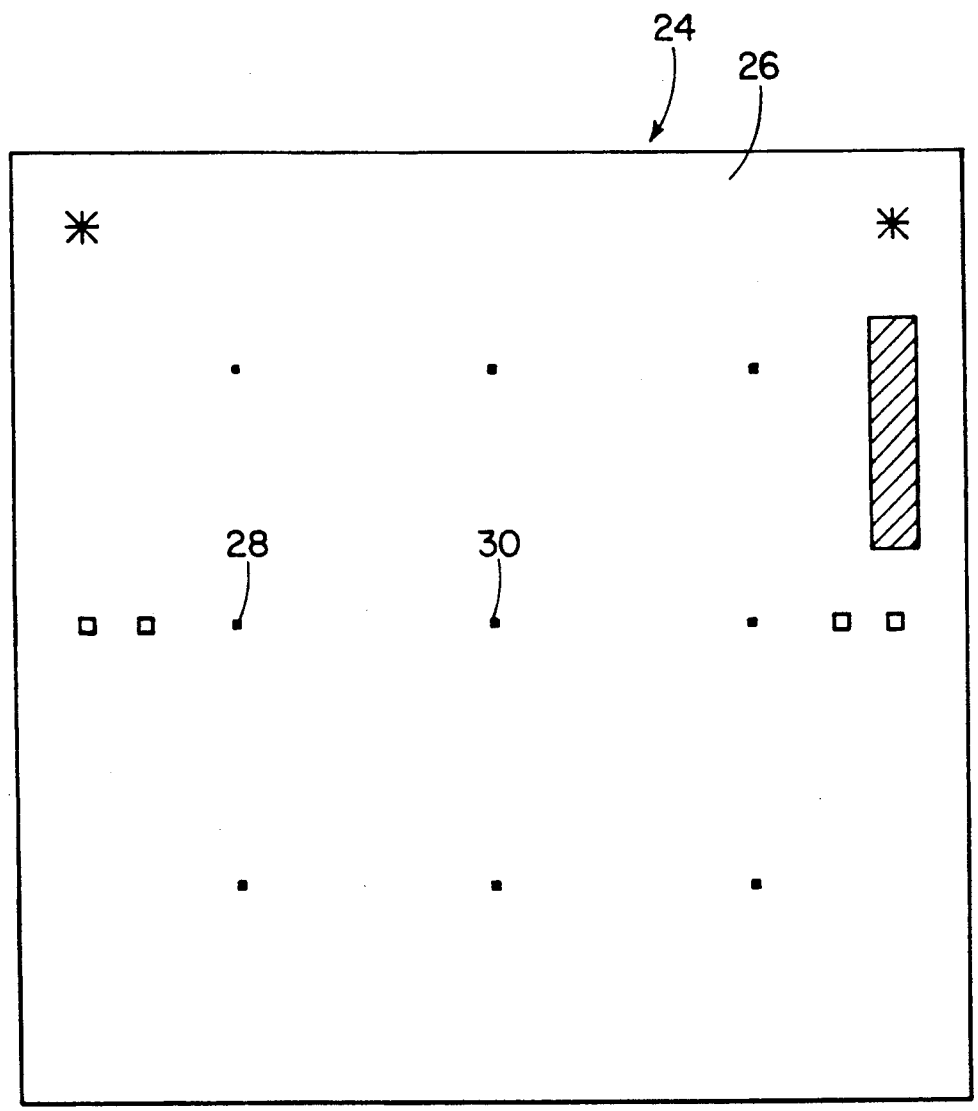
FIG. 3 is a top plan view of a reticle used to create the pattern shown in FIG. 2.

Turning now to FIG. 3, a reticle 24 constructed in accordance with the present invention includes a substantially planar transparent film 26. In the present embodiment of the invention, film 26 is 127×127 millimeters. A plurality of reticle patterns, like patterns 28, 30 are printed on film 26. As will later be discussed in more detail, a projected image of reticle pattern 28 is used to form each of the reticle images in matrix 18 and the projected image of reticle pattern 30 is used to form each of the reticle images in matrix 16. Similarly, each of the other reticle patterns on film 26 forms the corresponding reticle images in a different one of the matrices in matrix field 14.

Figure 4:
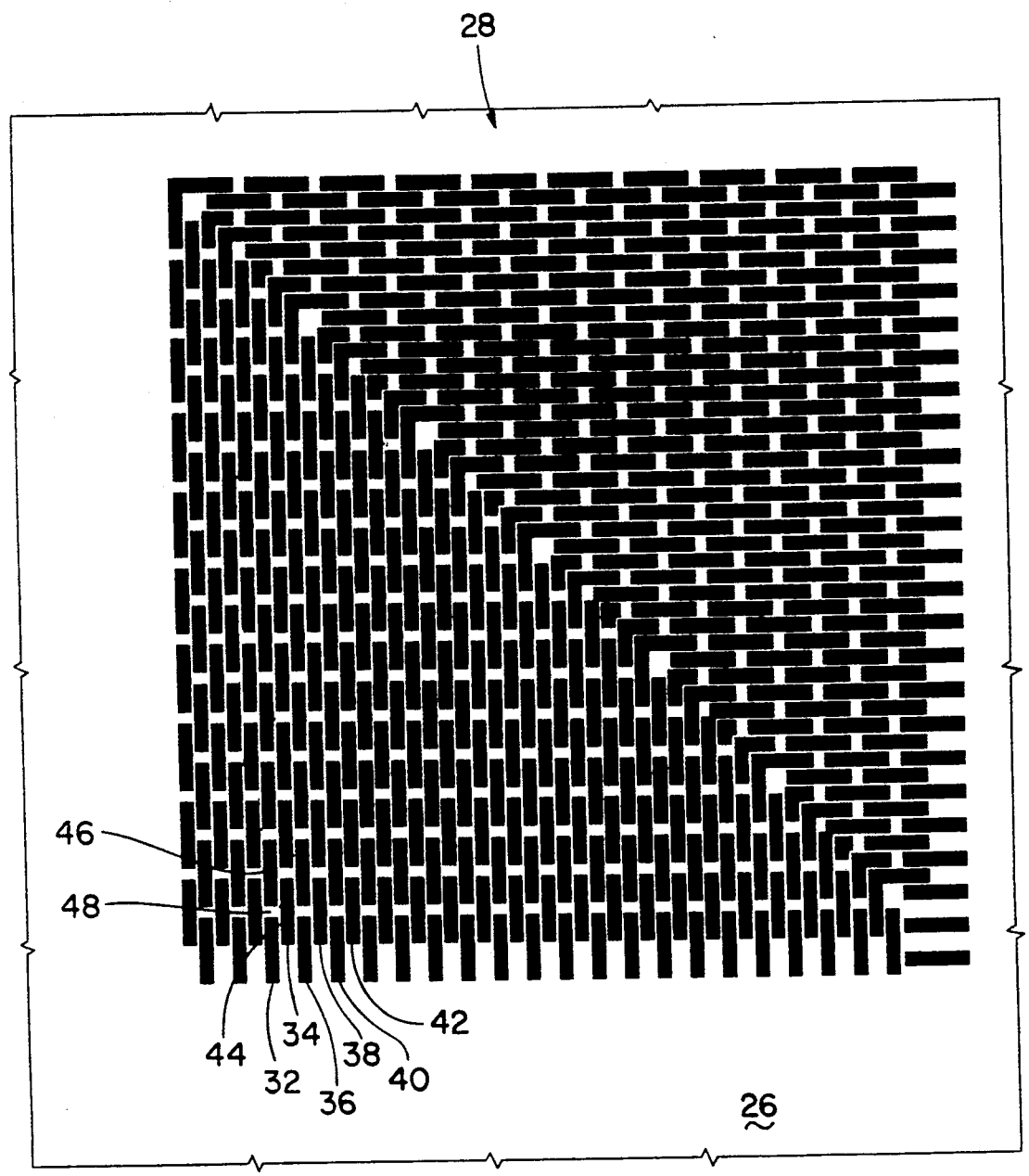
FIG. 4 is an enlarged portion of the reticle shown in FIG. 3.

Turning now to FIG. 4 reticle pattern 28 includes a plurality of parallel, opaque rectangles, like rectangles 32–42. Each of rectangles 32–42, and each of the other rectangles in reticle pattern 28, are made up of a thin layer of chrome which is etched in a conventional process to form pattern 28 and each of the other patterns, like pattern 30, on reticle 24. It should be noted that each of the other eight reticle patterns on reticle 24 is substantially identical to reticle pattern 28.

Rectangle 32 is at the lower end of a row of rectangles co-axial with rectangle 32 and extending upwardly therefrom in the view of FIG. 4. Each of the other rectangles 34–42 is contained in a similar row with rectangles 32, 34, 36, 38, 40, 42 being contained in first, second, third, fourth, fifth and sixth rows, respectively. As can be seen, at least for the lower portion of pattern 28, each rectangle in rows one, three and five is directly opposite a corresponding rectangle in one of the other first, third and fifth rows. Similarly, each rectangle in the second, fourth and sixth rows is directly opposite a corresponding rectangle in each of the other second, fourth and sixth rows.

Adjacent rows of rectangles, like the first and second rows, are separated by elongate, transparent segments, like segment 44 between rectangles 32, 34. Adjacent rectangles in the same row, like rectangles 32, 46, are separated from one another by a transparent film section, like rectangles 32, 46 are separated by section 48.

As can be seen, adjacent rows are staggered relative to one another so that the mid-portion of a rectangle in one row is adjacent a transparent film section in the adjacent row, like rectangle 34 is adjacent section 48.

As can be seen in FIG. 4, the rectangles in the lower left portion of pattern 28 are oriented at an angle of 90 degrees relative to the rectangles in the upper right portion of pattern 28.

Consideration will now be given to the manner in which reticle 24 is used to form matrix field 14 on wafer 10. First, the wafer coated with a layer of photoresist and then set on the wafer table of a commercially available wafer stepper. Reticle 24 is inserted in the mask holder of the wafer stepper thereby enabling an image of the patterns on reticle 24 to be projected onto the wafer photoresist. Next, the wafer stepper is set into nominal focus in accordance with the manufacturer's specification. A first exposure is then made thus projecting each of the reticle patterns, like patterns 28, 30, into a different one of the matrixes, like matrixes 16, 18, in matrix field 14. Thereafter, the height of the wafer table is moved upwardly by 0.2 micron and shifted laterally so as to form the next adjacent reticle image, like images 20, 22, in each matrix. Thereafter, the wafer table is again shifted upwardly by 0.2 micron and the wafer moved laterally to create the next image.

With references to FIG. 2, row 11 is made up of images exposed at the nominal focus setting with rows 11–21 containing images taken at each increasing 0.2 micron setting of the table. Similarly, additional exposures are taken by moving the table downwardly from the nominal focus row by 0.2 micron until the images in row 1 are formed with the table 2.0 micron below the nominal focus setting. As will be recalled, since the reticle includes nine patterns, like patterns 28, 30, thereon, each exposure defines one image in each of the nine matrixes formed on the wafer.

After all exposures are taken, the wafer is developed in the usual fashion and examined under a microscope.

Figure 5:
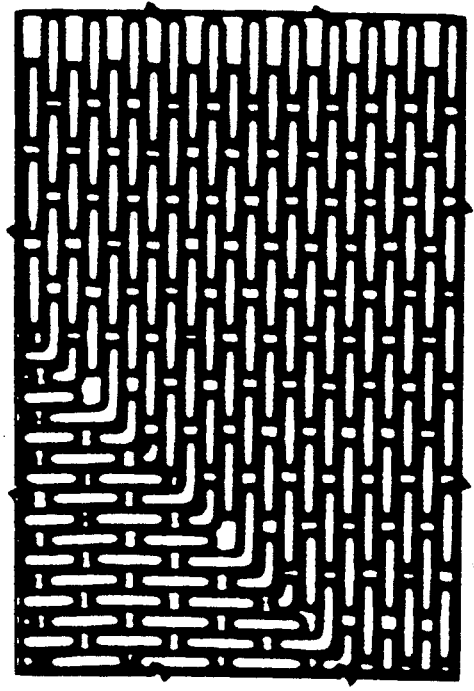
FIG. 5 is an enlarged view of an unfocused reticle image in the developed pattern shown in FIG. 2.
Figure 6:
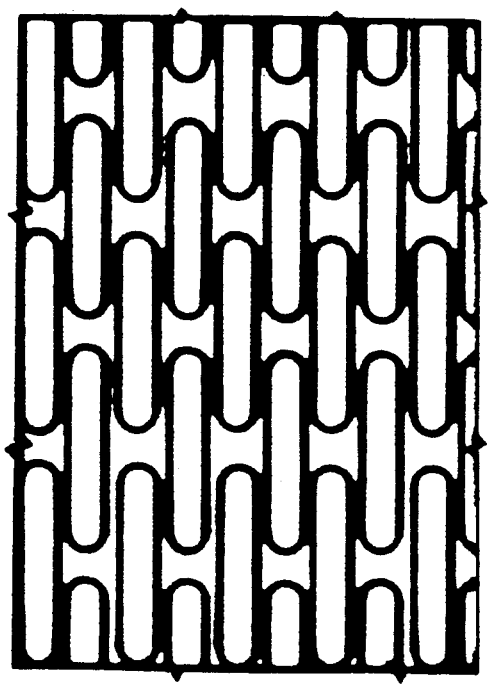
FIG. 6 is an enlarged view of FIG. 5.

Directing attention now to FIG. 5, in reticle image 22, photoresist which has been exposed to light is washed away while the photoresist blocked from the light remains. Reticle image 22 includes "bridging" between adjacent rectangle images. This is due to the fact that when the surface of the photoresist is not directly in the focal plane of the wafer stepper lens, the edge between the rectangle and transparent portions of the image is fuzzy thus permitting bridging as shown in FIG. 5. FIG. 6 is an enlarged view of FIG. 5 and more clearly shows such bridging.

Figure 7:
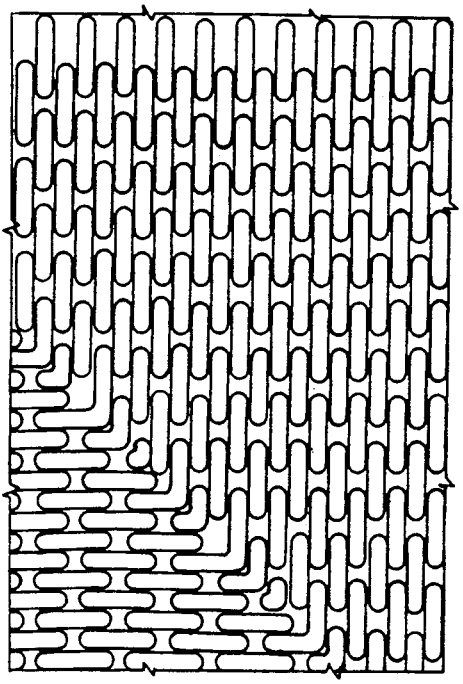
FIG. 7 is an enlarged view of a focused reticle image in the developed pattern shown in FIG. 2.
Figure 8:
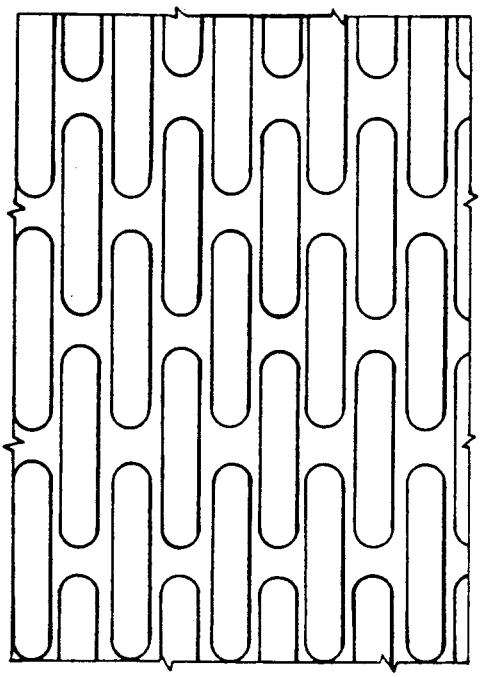
FIG. 8 is an enlarged view of FIG. 7.

Turning now to FIG. 7, reticle image 20 is seen to be more clearly in focus than reticle image 22, i.e., there is no bridging between adjacent rectangle images. This is seen more clearly in FIG. 8. Empirical testing of the repeatability of selecting in-focus reticle images on a particular wafer has determined that the reticle pattern of FIG. 4 permits more accurately selecting the best focused image over prior art reticles.

In the images of FIGS. 5–8, the width of the space between adjacent rectangle images is approximately 0.55 microns while the width of each rectangle image is approximately 2.2 microns. The present embodiment of the invention is for use on a 5x reduction stepper and therefore the corresponding dimensions on reticle 24 are five times larger than those in the reticle image on the photoresist.

The present embodiment of the invention can also be used to select an appropriate exposure level by sequentially stepping exposure levels from the first column to the last column and examining the rectangle images. Exposure is more best when the rectangle images include square corners with rounded corners on the reticle images being and indication of incorrect exposure.

A prior art reticle image is illustrated in FIGS. 9–12, with FIG. 9 including patterns made up of alternate bars. Each numeral, like 0.7, is the width, in microns, of the spaces and lines formed in the photoresist to the right and below each number. Although the width of each set of spaces and lines varies, in each set the line width is equal to the space width.

FIG. 10 is an enlarged view of FIG. 9. FIG. 11 is a view showing a more-focused reticle image than that of FIG. 9 with FIG. 12 being an enlarged view of FIG. 11.

The ratio of 1:1 of line width to space width in the prior art is not adequate to accurately set the wafer stepper focus. The present invention can be implemented with a rectangle to segment width ratio of at least 2:1; however, the ratio is preferably 4:1. It should be appreciated that the invention could be equally well implemented with a positive or negative photoresist. Thus, the rectangles could be transparent and the segments separating the rectangles opaque in an equivalent implementation of the present invention.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

We claim:

1. Apparatus for focusing a lens system in which a lens projects an image of a mask to create a lithographically-defined pattern on a wafer, said lens having a focal plane which is substantially parallel to a wafer received in said system, said apparatus comprising:
   means for adjusting the position of the lens focal plane and a surface of the wafer relative to one another;
   a reticle having a plurality of parallel, opaque rectangles formed thereon; and
   a plurality of elongate, transparent segments disposed between said rectangles and having elongate edges which define edges of adjacent rectangles, said rectangles having a width bearing a ratio to the width of said segments of in excess of 2:1.

2. The apparatus of claim 1 wherein said ratio is substantially 4:1.

3. The apparatus of claim 2 wherein said apparatus further includes additional opaque rectangles formed on said reticle coaxial with each of said parallel rectangles.

4. The apparatus of claim 3 wherein said reticle includes additional opaque rectangles oriented at substantially 90 degrees to each other.

5. The apparatus of claim 1 wherein said transparent segments each have a width of approximately 2.5 microns.

6. A method for focusing a lens used to create a lithographically-defined pattern on a wafer, said method comprising the steps of:
   coating a surface of the wafer with a layer of photoresist;
   positioning the wafer substantially parallel to a focal plane of the lens;
   adjusting the position of the lens focal plane and the surface of the wafer relative to one another;
   using the lens to project an image having alternating light bands onto the photoresist, such light bands being separated by a distance bearing a ratio to the width of said light bands of at least 2:1;
   developing said photoresist; and
   examining the developed photoresist to determine whether or not the lens focal plane and the wafer surface are substantially aligned.

7. The method of claim 6 wherein the step of using the lens to project an image of alternating light bands comprises the step of projecting such an image in which the ratio of the distance between adjacent light bands to the width of said light bands is substantially 4:1.

8. The method of claim 7 wherein the step of using the lens to project an image of alternating light bands comprises the step of projecting alternating light bands oriented at 90 degrees to each other.

9. The method of claim 7 wherein the step of using the lens to project an image of alternating light bands comprises the step of positioning a reticle adjacent said lens on a side of said lens opposite said wafer.

10. A reticle for projecting a focusing image on a wafer comprising:
    a substantially planar film;
    a plurality of parallel, opaque rectangles formed on said film;
    first, third and fifth rows of said rectangles in which the rectangles are positioned end-to-end with a transparent film section separating one rectangle end from the end of the next adjacent rectangle, each rectangle in one of the rows being aligned with a rectangle in each of the other two rows; and
    second, fourth and sixth rows of said rectangles in which the rectangles are positioned end-to-end with a transparent film section separating one rectangle end from the next, each rectangle in one of the second, fourth and sixth rows being aligned with a rectangle in each of the other two of said second, fourth and sixth rows and the rectangles in said second, fourth and sixth rows further being staggered relative to the rectangles in said first, third and fifth rows.

11. The reticle of claim 10 wherein said reticle further includes an elongate, transparent film segment disposed between each row of rectangles and having elongate edges which define the edges of adjacent rectangles.

12. The reticle of claim 11 wherein said rectangles have a width bearing a ratio to the width of said segments of in excess of 2:1.

13. The reticle of claim 12 wherein said ratio is substantially 4:1.

* * * * *